US010223942B2

United States Patent
Chu

(10) Patent No.: US 10,223,942 B2
(45) Date of Patent: Mar. 5, 2019

(54) ROLLABLE DISPLAY DEVICE

(71) Applicant: BOE TECHNOLOGY GROUP CO., LTD., Beijing (CN)

(72) Inventor: Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 15/513,953

(22) PCT Filed: Mar. 1, 2016

(86) PCT No.: PCT/CN2016/075166
§ 371 (c)(1),
(2) Date: Mar. 23, 2017

(87) PCT Pub. No.: WO2016/155450
PCT Pub. Date: Oct. 6, 2016

(65) Prior Publication Data
US 2017/0278436 A1    Sep. 28, 2017

(30) Foreign Application Priority Data

Mar. 31, 2015 (CN) .......................... 2015 1 0150328

(51) Int. Cl.
*G09F 9/30* (2006.01)
*H01L 51/00* (2006.01)
(Continued)

(52) U.S. Cl.
CPC ............ *G09F 9/301* (2013.01); *G06F 1/1615* (2013.01); *G06F 1/1652* (2013.01); *G09F 9/30* (2013.01);
(Continued)

(58) Field of Classification Search
CPC ..................................................... G03B 21/58
See application file for complete search history.

(56) References Cited

U.S. PATENT DOCUMENTS

| 8,516,728 B2 | 8/2013 | Jung |
| 2005/0145589 A1 | 7/2005 | Chen |

(Continued)

FOREIGN PATENT DOCUMENTS

| CN | 1714379 A | 12/2005 |
| CN | 201185067 Y | 1/2009 |

(Continued)

OTHER PUBLICATIONS

International Search Report and Written Opinion in PCT/CN2016/075166 dated May 20, 2016, with English translation. 16 pages.

(Continued)

*Primary Examiner* — Christopher E Mahoney
(74) *Attorney, Agent, or Firm* — Womble Bond Dickinson (US) LLP

(57) ABSTRACT

A rollable display device is disclosed, comprising a flexible display screen, a housing, a roller pivoted onto the housing and a holder mounted onto the housing. At least one of a third side and a fourth side of the flexible display screen which are connected with a first side and a second side is provided with a first locking element, and the holder is provided with a second locking element. The first locking element and the second locking element are magnetically connected to maintain relative positional relationship between the flexible display screen and the holder when the holder and the flexible display screen are expanded.

16 Claims, 4 Drawing Sheets

(51) Int. Cl.
*G06F 1/16* (2006.01)
*H01L 51/52* (2006.01)

(52) U.S. Cl.
CPC ........ *H01L 51/0097* (2013.01); *G06F 1/1679* (2013.01); *H01L 51/52* (2013.01); *H01L 2251/5338* (2013.01)

(56) References Cited

U.S. PATENT DOCUMENTS

| | | | |
|---|---|---|---|
| 2012/0050015 A1* | 3/2012 | Low | G06K 7/10158 340/10.1 |
| 2015/0047796 A1* | 2/2015 | Peng | E06B 9/42 160/323.1 |
| 2016/0161983 A1* | 6/2016 | Lee | G06F 1/1652 361/749 |
| 2017/0156225 A1* | 6/2017 | Heo | H05K 1/028 |

FOREIGN PATENT DOCUMENTS

| | | |
|---|---|---|
| CN | 201655172 U | 11/2010 |
| CN | 202601112 U | 12/2012 |
| CN | 102956161 A | 3/2013 |
| CN | 103511816 A | 1/2014 |
| CN | 104378936 A | 2/2015 |
| CN | 104424844 A | 3/2015 |
| CN | 204215671 U | 3/2015 |
| CN | 104732890 A | 6/2015 |

OTHER PUBLICATIONS

Office Action in Chinese Application No. 201510150328.6 dated Sep. 1, 2016, with English translation. 7 pages.

\* cited by examiner

ROLLABLE DISPLAY DEVICE

RELATED APPLICATIONS

The present application is the U.S. national phase entry of PCT/CN2016/075166, with an international filing date of Mar. 1, 2016, which claims the benefit of Chinese Patent Application NO. 201510150328.6, filed on Mar. 31, 2015, the entire disclosure of which is incorporated herein by reference.

TECHNICAL FIELD

The present disclosure relates to a display technical field, and particularly to a rollable display device.

BACKGROUND

With respect to the rollable display device, edges of two sides of the flexible display screen which are connected with the fixed side and the extension side are portions of the flexible display screen that are most prone to damage, the service life of these portions have a direct influence on the service life of the entire rollable display device.

Therefore, how to protect the two sides of the flexible display screen that are connected with the fixed side thereof when the flexible display screen of the rollable display device is expanded is one of technical problems that need to be addressed as a matter of urgency.

SUMMARY

A rollable display device is provided in the embodiments of the present disclosure. When the rollable display device is expanded, the flexible display screen can be steadily engaged with the holder, thereby mitigating damage to the flexible display screen and prolonging service life of the rollable display device.

The rollable display device according to an embodiment of the present disclosure comprises a flexible display screen, a housing having an outlet for extension of the flexible display screen, a roller pivoted onto the housing, and a holder mounted onto the housing. A first side of the flexible display screen is mounted onto the roller, and a second side of the flexible display screen opposite to the first side is capable of extending from the housing through the outlet. At least one of a third side and a fourth side of the flexible display screen which are connected with the first side and the second side is provided with a first locking element, and the holder is provided with a second locking element. The first locking element and the second locking element are magnetically connected to maintain relative to positional relationship between the third side and the fourth side of the flexible display screen and the holder when the holder and the flexible display screen are expanded.

With the rollable display device as provided in this embodiment, when the flexible display screen is expanded, the relative positional relationship between the flexible display screen and the holder can be maintained by means of magnetic connection between the first locking element and the second locking element, so when the flexible display screen is expanded, its third side and fourth side each have an edge of a relatively greater stability. Moreover, the first locking element and the second locking element are magnetically connected with each other, thus they are simple in structure and devoid of complex mating structures, whereby the locking elements themselves are free of damage to the flexible display screen, so that the third side and the fourth side of the flexible display screen after being expanded are less prone to damage, and the service life of the rollable display device can be prolonged.

In an embodiment of the present disclosure, the first locking elements do not overlap with each other on a surface of the roller when the flexible display screen is rolled up onto the roller.

In an embodiment, when the flexible display screen is expanded, the third side and the fourth side of the flexible display screen are in the shape of a straight line, and a distance between the third side and the fourth side gradually decreases along a direction from the first side to the second side of the flexible display screen.

In another embodiment, when the flexible display screen is expanded, when the flexible display screen is expanded, the third side is in a shape of sawtooth, each serrature of the third side comprises a segment perpendicular to the first side for mounting the first locking element, the first locking element mounted on the third side comprises first sub-locking elements in one-to-one correspondence with the serrature of the third side, and the first sub-locking element is provided on the segment for mounting the first locking element.

In another embodiment, when the flexible display screen is expanded, the fourth side is in a shape of sawtooth, each serrature of the fourth side comprises a segment perpendicular to the first side for mounting the first locking element, the first locking element mounted on the fourth side comprises first sub-locking elements in one-to-one correspondence with the serrature of the fourth side, and the first sub-locking element is provided on the segment for mounting the first locking element.

In an embodiment, the first locking element comprises an electromagnetic shielding layer on a surface of the flexible display screen that would face the holder when the flexible display screen is expanded, and a magnetic stripe on a surface of the electromagnetic shielding layer facing the holder or a plurality of magnetic members evenly distributed along the third side and the fourth side of the flexible display screen. The second locking element comprises attraction members which are in magnetic cooperation with the magnetic stripe or magnetic members when the holder and the flexible display screen are expanded.

Further, the magnetic members may comprise electromagnets or permanent magnets, and the attraction members may comprise a plurality of electromagnets, permanent magnets or iron blocks in one-to-one correspondence with the magnetic members.

Further, the holder may be provided with alignment grooves in one-to-one correspondence with the magnetic members, and the attraction members may be located in the alignment grooves.

In an embodiment, the holder may comprise a plurality of segments of sliding racks that are glidingly connected with each other in sequence, each sliding rack is provided with a second sub-locking element. The second sub-locking elements jointly form the second locking element when the plurality of segments of sliding racks spread out.

Further, among the plurality of segments of sliding racks, every two adjacent sliding racks may be glidingly connected by means of a slide rail and a slide block.

BRIEF DESCRIPTION OF DRAWINGS

Embodiments of the present disclosure will be explained in detail below in conjunction with the appended drawings, the appended drawings are used only to illustrate the structure of the rollable display device or some components thereof as provided in the embodiments of the present disclosure, and actual rollable display device or components are not limited to the size and shape as illustrated.

DETAILED DESCRIPTION OF EMBODIMENTS

Technical solutions in embodiments of the present disclosure will be explained clearly and completely in conjunction with the appended drawings for the embodiments. Obviously, the illustrated embodiments are merely part of, rather than all of, the embodiments of the present invention. Based on these embodiments of the present disclosure, other embodiments as obtained without inventive effort by a person having an ordinary skill in the art shall fall within the scope of the present invention.

A rollable display device generally comprises a housing, a scroll pivoted onto the housing, a flexible display screen, and a holder for holding the flexible display screen after being expanded. The housing has an outlet for flexible display screen extension, a fixed side of the flexible display screen is connected to the scroll, and an extension side thereof can extend out through the outlet of the housing. When the flexible display screen of the rollable display device is rolled up, the flexible display screen winds around the scroll and is situated within the housing, and the holder is retracted; when the flexible display screen of the rollable display device is expanded, the holder spreads out to support the flexible display screen.

Figure 1:
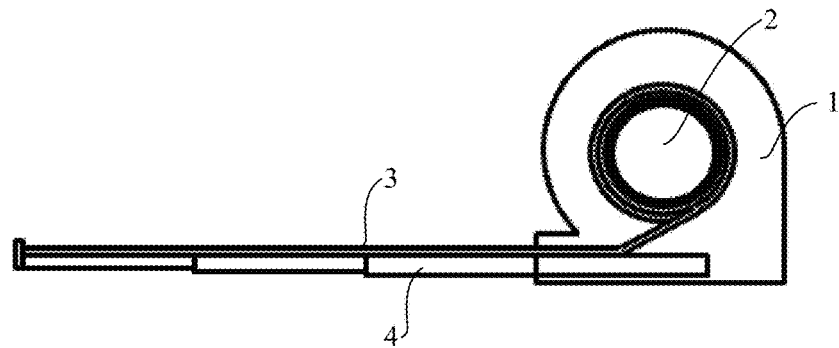
FIG. 1 is a structural schematic view of the rollable display device as provided in an embodiment of the present disclosure.
Figure 2:
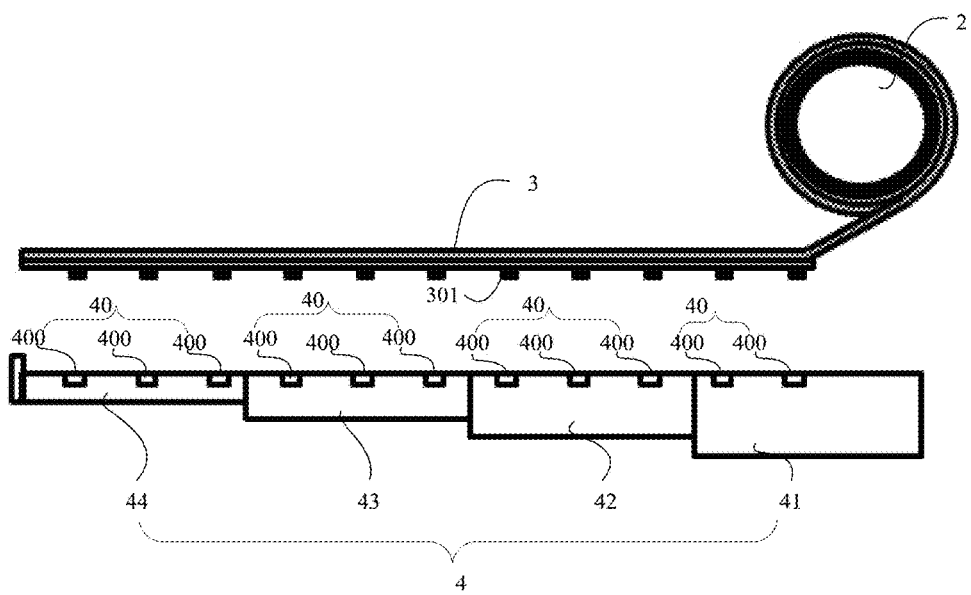
FIG. 2 illustrating the cooperation between the flexible display screen and the holder in the rollable display device as provided in an embodiment of the present disclosure.

Referring to FIG. 1 and FIG. 2, a rollable display device provided in an embodiment of the present disclosure may comprise a flexible display screen 3, a housing 1 having an outlet for flexible display screen extension, a roller 2 pivoted onto the housing 1, a holder 4 mounted onto the housing 1. A first side of the flexible display screen 3 is mounted to the roller 2, and a second side opposite to the first side of the flexible display screen is capable of extending from the housing 1 through the outlet for flexible display screen extension. At least one of a third side and a fourth side of the flexible display screen which are connected with the first side and the second side is provided with a first locking element, and a second locking element is provided on the holder 4. When the holder 4 and the flexible display screen 3 are expanded, the first locking element and the second locking element are magnetically connected so as to maintain the relative positional relationship between the third side and the fourth side of the flexible display screen 3 and the holder 4.

With the rollable display device as provided in the embodiment of the present disclosure, when the flexible display screen 3 is expanded, the relative positional relationship between the flexible display screen 3 and the holder 4 can be maintained by means of the magnetic connection between the first locking element and the second locking element provided on the holder 4, in this way, when the flexible display screen 3 is expanded, its third side and fourth side each has an edge of a relatively greater stability. Moreover, the first locking element and the second locking element are capable of being magnetically connected with each other, thus the first locking element and the second locking element are simple in structure and devoid of complex mating structures, thereby the locking elements themselves are free of damage to the flexible display screen 3. Consequently, the third side and the fourth side of the flexible display screen 3 after being expanded are less prone to damage, which is beneficial to prolong the service life of the rollable display device.

Figure 4:
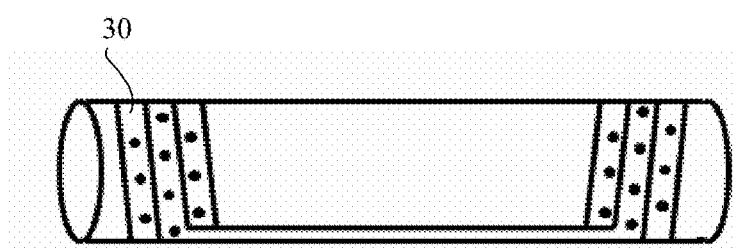
FIG. 4 illustrates a state of the flexible display screen in accordance with the embodiment shown in FIG. 3 when being rolled up onto the roller 1.
Figure 6:
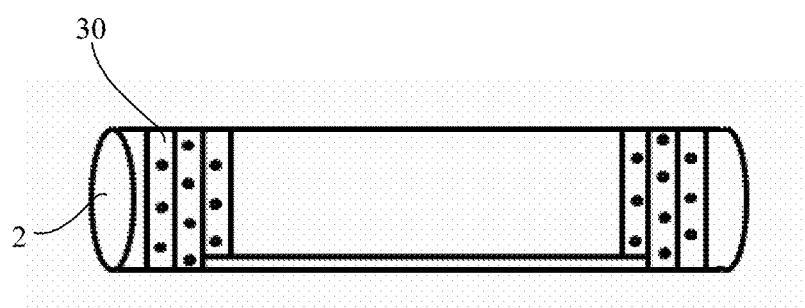
FIG. 6 illustrates a state of the flexible display screen in accordance with the embodiment shown in FIG. 5 when being rolled up onto the roller.

In some embodiments of the present disclosure, as shown in FIG. 4 and FIG. 6, in order to enable the flexible display screen 3 after being rolled up onto the roller 2 to occupy a smaller space, the first locking elements may be configured such that they do not overlap with each other on a surface of the roller 2 when the flexible display screen 3 is rolled up onto the roller 2.

Figure 3:
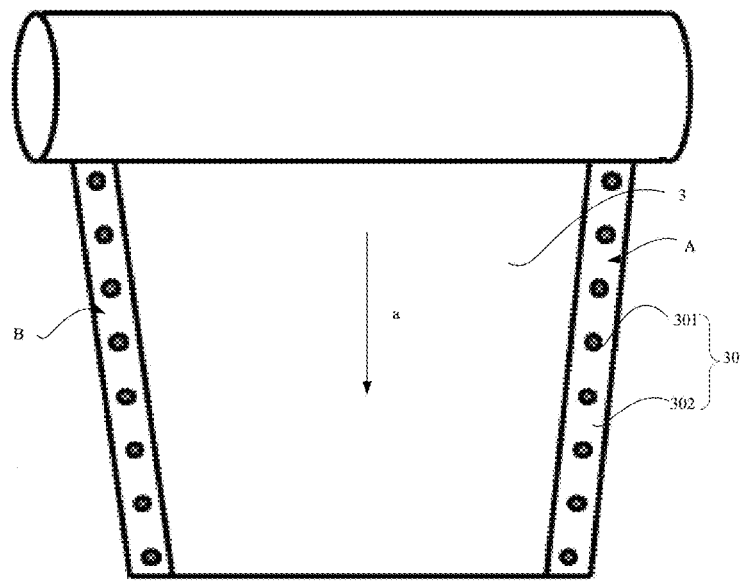
FIG. 3 is a structural schematic view of the flexible display screen of the rollable display device as provided in an embodiment of the present disclosure.

By way of example, in an embodiment, as shown in FIG. 3, when the flexible display screen 3 is expanded, the third side A and the fourth side B of the flexible display screen 3 may be in the shape of a straight line, and the distance between the third side A and the fourth side B may gradually decrease along a direction from the first side to the second side of the flexible display screen (e.g., the direction indicated by a in FIG. 3). Specifically, FIG. 4 illustrates a state of the flexible display screen 3 being rolled up onto the roller 2 as provided in the embodiment.

Figure 5:
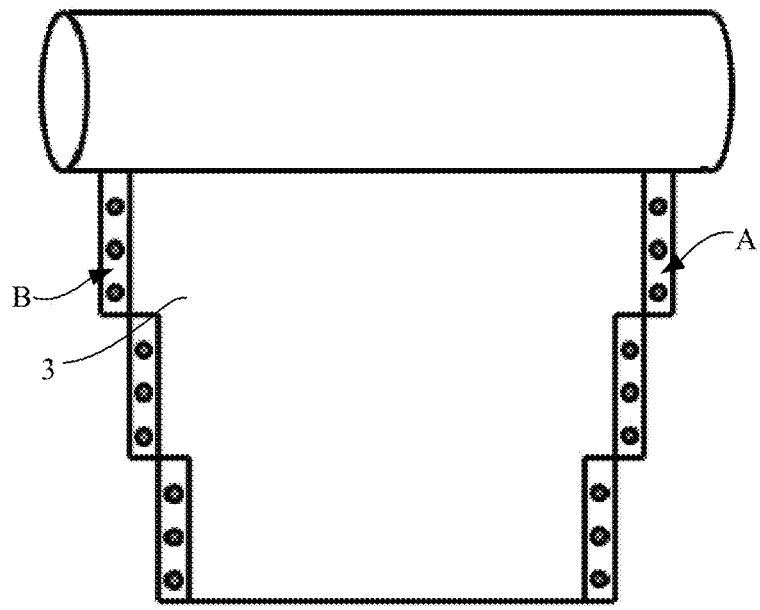
FIG. 5 is a structural schematic view of the flexible display screen of the rollable display device as provided in another embodiment of the present disclosure.

In another embodiment, as shown in FIG. 5, when the flexible display screen 3 is expanded, the third side A may be in a shape of sawtooth, each serrature of the third side A may comprise a segment perpendicular to the first side for mounting the first locking element. The first locking elements arranged on the third side A thus may comprise first sub-locking elements in one-to-one correspondence with the serrature of the third side A, and the first sub-locking elements may be provided on the segment for mounting the first locking element.

Likewise, the fourth side B may be similar to the third side A in structure. As shown in FIG. 5, when the flexible display screen 3 is expanded, the fourth side B may be in a shape of sawtooth, each serrature of the fourth side B may comprise a segment perpendicular to the first side for mounting the first locking element. The first locking elements arranged on the fourth side B thus may comprise first sub-locking elements in one-to-one correspondence with the serrature of the fourth side B, and the first sub-locking elements may be provided on the segment for mounting the first locking element.

Figure 7:
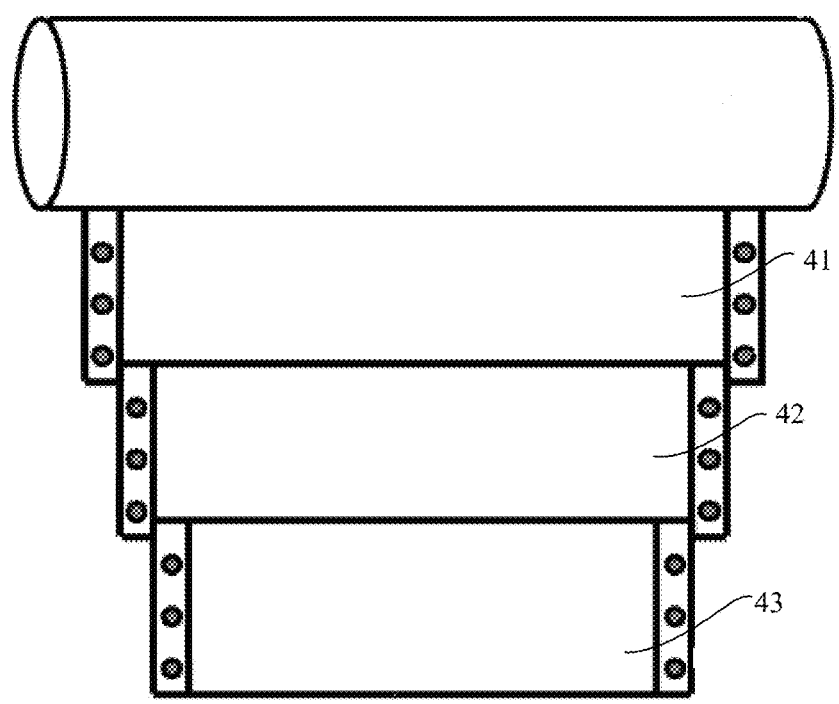
FIG. 7 is a structural schematic view of a holder corresponding to the flexible display screen in accordance with the embodiment as shown in FIG. 6.

When the flexible display screen 3 as provided in this embodiment is rolled up onto the roller 2, the third side A and the fourth side B of the flexible display screen 3 may have a state as shown in FIG. 6, and the holder 4 may have a shape shown in FIG. 7.

In an embodiment, as shown in FIG. 3, the first locking element 30 may comprise an electromagnetic shielding layer 302 on a surface of the flexible display screen 3 that would face the holder 4 when the flexible display screen 3 is expanded, and a magnetic stripe on the electromagnetic shielding layer 302 or a plurality of magnetic members 301 evenly distributed along the third side A and the fourth side B of the flexible display screen 3. Correspondingly, as shown in FIG. 2, the second locking element may comprise attraction members on the holder which are in magnetic cooperation with the magnetic stripe or magnetic members 301 when the holder 4 and the flexible display screen 3 are expanded. Although in the embodiment shown in FIG. 3, each of the third side A and the fourth side B of the flexible display screen that are connected with the first side and the second side is provided with the first locking elements 30, in other embodiments, it is possible that only one of the third side A and the fourth side B is provided with the first locking elements 30.

In an embodiment, the magnetic members may comprise electromagnets or permanent magnets, and the attraction members may comprise a plurality of electromagnets, permanent magnets or iron blocks in one-to-one correspondence with the magnetic members.

In an embodiment, the holder 4 may be provided with alignment grooves 400 in one-to-one correspondence with the magnetic members 301, and the attraction members may be respectively located in the alignment grooves 400. When the magnetic members 301 of the flexible display screen 3 are attracted to the attraction members of the holder 4, the magnetic members 301 may be embedded into the alignment grooves 400 of the holder 4, which not only can ensure a precise alignment between the expanded flexible display screen 3 and the holder 4, but also can enable a better engagement of the expanded flexible display screen 3 with the holder 4, ensuring a stable locking of the expanded flexible display screen 3 with the holder 4.

As shown in FIG. 2, in an embodiment of the present disclosure, the holder 4 comprises a plurality of segments of sliding racks, such as sliding racks 41, 42, 43 and 44, that are glidingly connected with each other in sequence, each sliding rack is provided with a second sub-locking element 40. When the plurality of segments of sliding racks spread out, the second sub-locking elements 40 may jointly form the second locking element. Since the holder 4 may be constituted by a plurality of segments of sliding racks that are sequentially in sliding cooperation with each other, respective sliding rack of the holder 4 may extend synchronously with the flexible display screen 3 in according to the out-extension length and out-extension speed of the flexible display screen 3, such that the flexible display screen 3 can be locked onto a corresponding sliding rack by the first locking element and the second locking element after extending from the housing 1, thereby alleviating or avoiding damage to the flexible display screen 3 while extending from the housing 1.

In an embodiment, regarding to the plurality of segments of sliding racks of the holder 4, every two adjacent sliding racks may be glidingly connected by means of a slide rail and a slide block.

Apparently, a person having an ordinary skill in the art could make various modifications and variations to the embodiments of the present disclosure, without departing from the spirit and scope of the invention. In this way, if these modifications and variations fall within the scope of the claims and equivalents thereof, the present disclosure has an intention of including these modifications and variations as well.

The invention claimed is:

1. A rollable display device comprising:
a flexible display screen;
a housing having an outlet for extension of the flexible display screen;
a roller pivoted onto the housing, and
a holder mounted onto the housing,
wherein a first side of the flexible display screen is mounted onto the roller, and a second side of the flexible display screen opposite to the first side is capable of extending from the housing through the outlet,
wherein at least one of a third side and a fourth side of the flexible display screen which are connected with the first side and the second side is provided with a first locking element, and the holder is provided with a second locking element,
wherein the first locking element and the second locking element are magnetically connected to maintain relative positional relationship between the third side and the fourth side of the flexible display screen and the holder when the holder and the flexible display screen are expanded,
wherein the first locking element comprises a plurality of magnetic members distributed at intervals along the third side and the fourth side of the flexible display screen, and wherein the plurality of magnetic members are spaced apart from each other at a distance in a direction of a horizontal axis of the roller when the flexible display screen is rolled up onto the roller.

2. The rollable display device according to claim 1, wherein when the flexible display screen is expanded, the third side and the fourth side of the flexible display screen are in a shape of a straight line, and a distance between the third side and the fourth side gradually decreases along a direction from the first side to the second side of the flexible display screen.

3. The rollable display device according to claim 2, wherein the holder comprises a plurality of segments of sliding racks that are glidingly connected with each other in sequence, each sliding rack is provided with a second sub-locking element,
wherein the second sub-locking element jointly form the second locking element when the plurality of segments of sliding racks spread out.

4. The rollable display device according to claim 1, wherein when the flexible display screen is expanded, the third side is in a shape of sawtooth, each serrature of the third side comprises a segment perpendicular to the first side for mounting the first locking element, the first locking element mounted on the third side comprises first sub-locking elements in one-to-one correspondence with the serrature of the third side, and the first sub-locking element is provided on the segment for mounting the first locking element.

5. The rollable display device according to claim 4, wherein when the flexible display screen is expanded, the fourth side is in a shape of sawtooth, each serrature of the fourth side comprises a segment perpendicular to the first side for mounting the first locking element, the first locking element mounted on the fourth side comprises first sub-locking elements in one-to-one correspondence with the serrature of the fourth side, and the first sub-locking element is provided on the segment for mounting the first locking element.

6. The rollable display device according to claim 5, wherein the holder comprises a plurality of segments of sliding racks that are glidingly connected with each other in sequence, each sliding rack is provided with a second sub-locking element, wherein the second sub-locking elements jointly form the second locking element when the plurality of segments of sliding racks spread out.

7. The rollable display device according to claim 4, wherein the holder comprises a plurality of segments of sliding racks that are glidingly connected with each other in sequence, each sliding rack is provided with a second sub-locking element, wherein the second sub-locking elements jointly form the second locking element when the plurality of segments of sliding racks spread out.

8. The rollable display device according to claim 1, wherein the first locking element further comprises an electromagnetic shielding layer on a surface of the flexible display screen that would face the holder when the flexible display screen is expanded, and the plurality of magnetic members are arranged on the electromagnetic shielding layer, wherein the second locking element comprises attraction members which are in magnetic cooperation with the magnetic members when the holder and the flexible display screen are expanded.

9. The rollable display device according to claim 8, wherein the magnetic members comprise electromagnets or permanent magnets, and the attraction members comprise a plurality of electromagnets, permanent magnets or iron blocks in one-to-one correspondence with the magnetic members.

10. The rollable display device according to claim 9, wherein the holder comprises a plurality of segments of sliding racks that are glidingly connected with each other in sequence, each sliding rack is provided with a second sub-locking element, wherein the second sub-locking elements jointly form the second locking element when the plurality of segments of sliding racks spread out.

11. The rollable display device according to claim 8, wherein the holder is provided with alignment grooves in one-to-one correspondence with the magnetic members, and the attraction members are located in the alignment grooves.

12. The rollable display device according to claim 11, wherein the holder comprises a plurality of segments of sliding racks that are glidingly connected with each other in sequence, each sliding rack is provided with a second sub-locking element, wherein the second sub-locking elements jointly form the second locking element when the plurality of segments of sliding racks spread out.

13. The rollable display device according to claim 8, wherein the holder comprises a plurality of segments of sliding racks that are glidingly connected with each other in sequence, each sliding rack is provided with a second sub-locking element, wherein the second sub-locking elements jointly form the second locking element when the plurality of segments of sliding racks spread out.

14. The rollable display device according to claim 1, wherein the holder comprises a plurality of segments of sliding racks that are glidingly connected with each other in sequence, each sliding rack is provided with a second sub-locking element, wherein the second sub-locking elements jointly form the second locking element when the plurality of segments of sliding racks spread out.

15. The rollable display device according to claim 14, wherein among the plurality of segments of sliding racks, every two adjacent sliding racks are glidingly connected by means of a slide rail and a slide block.

16. The rollable display device according to claim 1, wherein the holder comprises a plurality of segments of sliding racks that are glidingly connected with each other in sequence, each sliding rack is provided with a second sub-locking element, wherein the second sub-locking elements jointly form the second locking element when the plurality of segments of sliding racks spread out.

* * * * *